(12) United States Patent
Brody et al.

(10) Patent No.: US 7,232,694 B2
(45) Date of Patent: Jun. 19, 2007

(54) SYSTEM AND METHOD FOR ACTIVE ARRAY TEMPERATURE SENSING AND COOLING

(75) Inventors: Thomas P. Brody, Pittsburgh, PA (US); Paul R. Malmberg, Pittsburgh, PA (US); Joseph A. Marcanio, Latrobe, PA (US)

(73) Assignee: Advantech Global, Ltd., Tortola (VG)

( * ) Notice: Subject to any disclaimer, the term of this patent is extended or adjusted under 35 U.S.C. 154(b) by 128 days.

(21) Appl. No.: 10/950,646

(22) Filed: Sep. 28, 2004

(65) Prior Publication Data

US 2006/0071227 A1    Apr. 6, 2006

(51) Int. Cl.
*H01L 21/00* (2006.01)
*G01R 31/26* (2006.01)

(52) U.S. Cl. .................................. 438/5; 438/14
(58) Field of Classification Search .............. 438/14, 438/5
See application file for complete search history.

(56) References Cited

U.S. PATENT DOCUMENTS

| | | | |
|---|---|---|---|
| 3,947,952 A | * | 4/1976 | Miller et al. .............. 438/113 |
| 5,589,000 A | * | 12/1996 | Harms et al. .............. 118/715 |
| 5,701,055 A | | 12/1997 | Nagayama et al. |
| 6,410,445 B1 | | 6/2002 | Fagerman |
| 6,592,933 B2 | | 7/2003 | Himeshima et al. |
| 6,610,178 B2 | | 8/2003 | Kato et al. |
| 2003/0193285 A1 | | 10/2003 | Kim |
| 2003/0228715 A1 | | 12/2003 | Brody et al. |

\* cited by examiner

*Primary Examiner*—Carl Whitehead, Jr.
*Assistant Examiner*—Candice Y. Chan
(74) *Attorney, Agent, or Firm*—Dickstein Shapiro LLP

(57) ABSTRACT

A system and method for active array temperature sensing and cooling. The system includes an active temperature sensing layer, a thermoelectric cooling layer and a heatsink layer. The temperature sensing layer is formed of temperature sensing elements that sense the temperature gradient across an unevenly heated region of the active array substrate. The thermoelectric cooling layer controls the temperature gradient sensed by the temperature sensing layer. The heatsink layer includes a plurality of cooling channels for absorbing thermal energy from the unevenly heated region. The system is under the control of a process control computer.

1 Claim, 7 Drawing Sheets

SYSTEM AND METHOD FOR ACTIVE ARRAY TEMPERATURE SENSING AND COOLING

FIELD OF THE INVENTION

The present invention relates to a shadow mask for forming electronic elements on a substrate. In particular, the present invention relates to ensuring accurate shadow mask-to-substrate registration in a high-temperature deposition production system.

BACKGROUND OF THE INVENTION

Active matrix backplanes are widely used in flat panel displays for routing signals to pixels of the display in order to produce viewable pictures. Presently, active matrix backplanes for flat panel displays are formed by performing a photolithography manufacturing process, which has been driven in the market by the demand for higher and higher resolution displays, which is not otherwise possible with other manufacturing processes. Photolithography is a pattern definition technique which uses electromagnetic radiation, such as ultraviolet (UV) radiation, to expose a layer of resist that is deposited on the surface of a substrate. Exemplary photolithography processing steps to produce an active matrix backplane include coat photoresist, pre-bake, soak, bake, align/expose, develop, rinse, bake, deposit layer, lift off photoresist, scrub/rinse, and dry. As can be seen, the active matrix backplane fabrication process includes numerous deposition and etching steps in order to define appropriate patterns of the backplane.

Because of the number of steps required to form an active matrix backplane with the photolithography manufacturing process, foundries of adequate capacity for volume production of backplanes are very expensive. An exemplary partial list of equipment needed for manufacturing active matrix backplanes includes glass-handling equipment, wet/dry strip equipment, glass cleaning equipment, wet clean equipment, plasma chemical vapor deposition (CVD) equipment, laser equipment, crystallization equipment, sputtering equipment, ion implant equipment, resist coater equipment, resist stripping equipment, developer equipment, particle inspection equipment, exposure systems, array filet/repair equipment, dry etch systems, anti-electrostatic discharge equipment, wet etch systems, and a clean oven. Furthermore, because of the nature of the active matrix backplane fabrication process, the foregoing equipment must be utilized in a class 1 or class 10 clean room. In addition, because of the amount of equipment needed and the size of each piece of equipment, the clean room must have a relatively large area, which can be relatively expensive.

Alternatively, a vapor deposition shadow mask process is well known and has been used for years in microelectronics manufacturing. The vapor deposition shadow mask process is a significantly less costly and less complex manufacturing process, compared to the photolithography process; however, the achievable resolution of, for example, an active matrix backplane formed via shadow mask technology, is limited. Today's shadow mask manufacturing techniques are limited to forming, for example, up to 80 pixels per inch, which is representative of, for example, a typical laptop display resolution. However, for small displays, such as in mobile phones and PDAs, a much higher resolution (up to 200 pixels per inch) is desired. Because of this demand for higher resolution, active matrix backplane manufacturers are migrating away from the less costly and less complex vapor deposition shadow mask process in favor of the photolithography process, but at the tradeoff of cost and complexity. Therefore, what is needed is a way to provide improved resolution that uses the more cost-effective vapor deposition shadow mask process and thereby extends its use in the manufacturing of flat panel displays.

Furthermore, in order to achieve improved resolution, the aperture size and spacing of the shadow mask is reduced accordingly. Therefore, the ability to maintain positional accuracy of the shadow mask in relation to the substrate during the deposition process becomes more and more critical to ensure proper placement of the electronic elements formed therewith. Because there are various heating effects that occur during a high-temperature deposition process, the ability to achieve small microelectronics dimensions and, thus, high resolution, by use of the vapor deposition shadow mask process is limited by thermal errors that play a considerable role in achieving positional accuracy. For example, the materials used for forming both the shadow mask and the substrate have an associated coefficient of thermal expansion (CTE). CTE is defined as the linear dimensional change of a material per unit change in temperature. A typical substrate material is anodized aluminum, which is aluminum atop which is grown a thin insulation layer. Aluminum has a CTE of 24 parts per million/degree Celsius (ppm/° C.). By contrast, typical materials used to form a shadow mask include nickel, stainless steel, and copper. Stainless steel has a CTE of 9.9–17.3 ppm/° C., copper has a CTE of 17 ppm/° C., and nickel has a CTE of 13.3 ppm/° C. Consequently, it is difficult to maintain proper registry between the two conjoined surfaces (i.e., the surface of the shadow mask in contact with the surface of the substrate), because of their differing CTEs, which results in different rates and amounts of expansion or contraction. This CTE mismatch creates geometric errors between the shadow mask and the substrate that are not tolerable.

Further, the radiant heat source used for vapor deposition produces hot spots and temperature gradients across the face of the shadow mask. As the shadow mask contains slots and holes, it does not come into uniform contact with the substrate to which it is mounted and, therefore it does not sink heat in a consistent way. As a result, thermal expansion can occur in the shadow mask relative to the substrate and thereby cause misregistration. To control this misregistration, specific locations on the shadow mask may need to be thermally regulated. By achieving a uniform temperature across the mask, uniform manufacture can take place. Accordingly, a need exists for a way to overcome the heating effects during a high-temperature deposition process and, thus, maintain positional accuracy of the shadow mask in relation to the substrate.

An exemplary system for fabricating an electronic device is described in U.S. Pat. No. 6,592,933, entitled "Process for Manufacturing Organic Electroluminescent Device." The '933 patent describes a method for producing an organic electroluminescent device, which is formed of a first electrode formed on a substrate, a thin film layer on the first electrodes, the thin film layer formed of at least an emitting layer formed of an organic compound, a second electrode formed on the thin film layer, and a plurality of luminescent regions on the substrate. The method for producing the organic electroluminescent device forms spacers that have a height which exceeds a thickness of the thin film layer on the substrate and vapor-deposits a deposit while a mask portion of a shadow mask is kept in contact with the spacers. The shadow mask forms apertures that have reinforcing lines. Highly precise, fine patterning can be effected under wide vapor deposition conditions without degrading the properties of organic electroluminescent elements, and high stability can be achieved by the method without limiting the structure of the electroluminescent device. While the '933 patent provides a suitable system for fabricating an electronic device, it does not address ways to overcome the heating effects that cause misregistration between the shadow mask and the substrate during a high-temperature deposition process. Therefore, the production system described in the '933 patent does not minimize temperature gradients across a shadow mask and substrate. Further, the invention of the '933 patent does not ensure negligible relative movement between the shadow mask and the substrate during any of the critical deposition stages of the manufacturing process and, therefore, does not extend the use of the vapor deposition shadow mask process for manufacturing high-resolution displays.

It is therefore an object of the invention to manufacture, for example, a flat panel display with improved resolution using the more cost-effective vapor deposition shadow mask process.

It is another object of this invention to overcome the heating effects that occur during a high-temperature deposition process and, thus, maintain positional accuracy of a shadow mask in relation to the substrate.

It is yet another object of this invention to provide a temperature measurement and cooling system to provide thermal regulation and minimize temperature gradients across a shadow mask and substrate.

It is yet another object of this invention to ensure negligible relative movement between the shadow mask and the substrate during any of the critical deposition stages of the manufacturing process.

BRIEF SUMMARY OF THE INVENTION

The system and method of the present invention overcomes the disproportionate heating effects that occur during a high-temperature deposition process by thermally regulating the shadow mask and substrate using an active array of temperature sensing and cooling elements and thereby achieves a uniform temperature across a shadow mask and, thus, ensures positional accuracy of the shadow mask in relation to a substrate. As a result, uniform manufacture can take place.

Other features and advantages of the present invention will become more apparent from the detailed description of exemplary embodiments provided below with reference to the accompanying drawings in which:

DETAILED DESCRIPTION OF THE INVENTION

Figure 1:
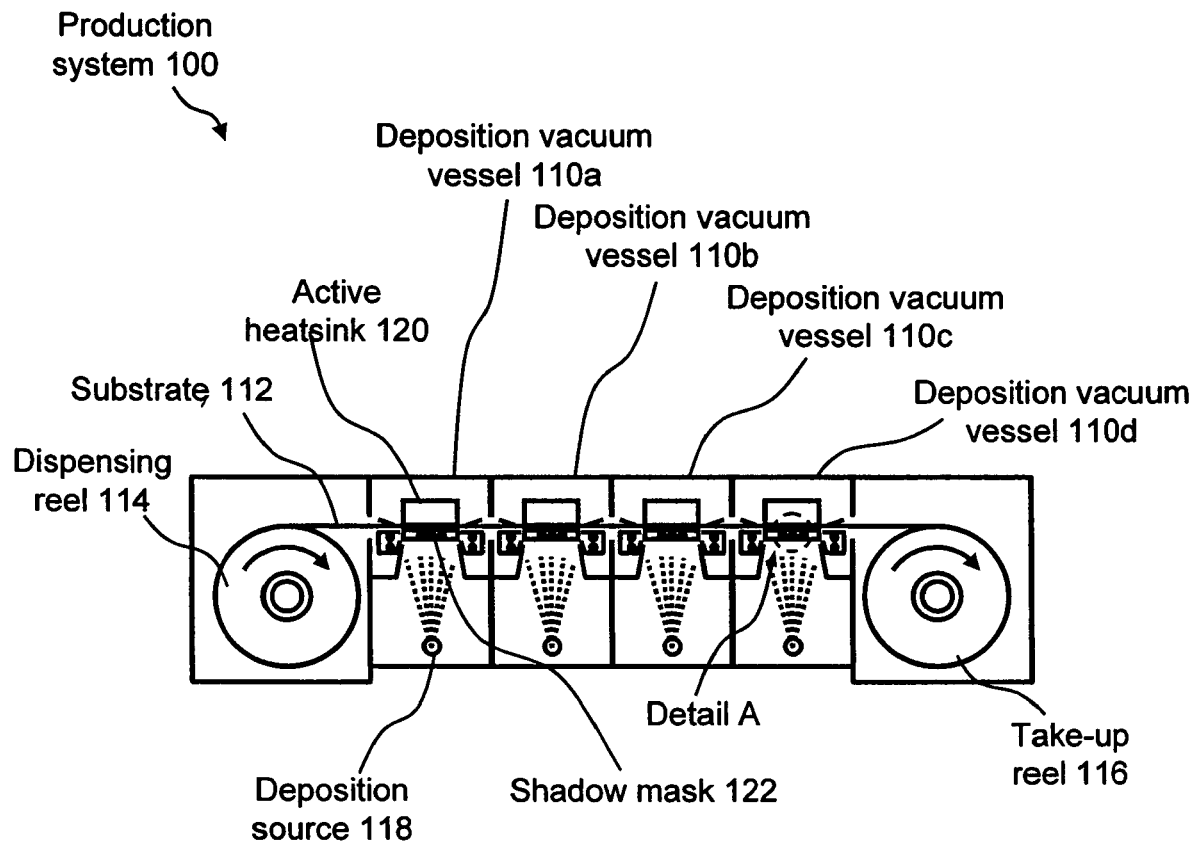
FIG. 1 illustrates a production system for ensuring proper shadow mask-to-substrate alignment by use of thermal regulation of shadow mask and substrate material in accordance with the present invention.

FIG. 1 illustrates a production system 100 for ensuring proper shadow mask-to-substrate alignment by use of thermal regulation in accordance with the present invention, thereby minimizing any misregistration therebetween that is caused by the effects of heating. Production system 100 is representative of a system for producing an electronic device, such as an active matrix backplane that has OLEDs deposited thereon.

Production system 100 is preferably as described in reference to U.S. Patent Application No. 2003/0228715, entitled "Active Matrix Backplane for Controlling Controlled Elements and Method of Manufacture Thereof," assigned to Amedeo Corporation (Pittsburgh, Pa.), which is incorporated herein by reference. The '715 patent application describes an electronic device formed from electronic elements deposited on a substrate. The electronic elements are deposited on the substrate by the advancement of the substrate through a plurality of deposition vacuum vessels that have at least one material deposition source and a shadow mask positioned therein. The material from at least one material deposition source positioned in each deposition vacuum vessel is deposited on the substrate through the shadow mask that is positioned in the deposition vacuum vessel, in order to form on the substrate a circuit formed of an array of electronic elements. The circuit is formed solely by the successive deposition of materials on the substrate.

With continuing reference to FIG. 1, production system 100 includes a plurality of deposition vacuum vessels 110 (i.e., deposition vacuum vessels 110a, 110b, 110c, and 110d). Production system 100 is not limited to four deposition vacuum vessels 110; the configuration shown in FIG. 1 is intended to be exemplary only. The number of deposition vacuum vessels 110 is dependent upon the number of deposition events required for any given product formed therewith.

Production system 100 further includes a substrate 112 that translates through the serially arranged deposition vacuum vessels 110 by use of a reel-to-reel mechanism that includes a dispensing reel 114 and a take-up reel 116. Each deposition vacuum vessel 110 further includes a deposition source 118, an active heatsink 120, and a shadow mask 122.

The deposition vacuum vessels 110 are arranged and connected in series. Each deposition vacuum vessel 110 includes one deposition source 118 that is charged with a desired material to be deposited onto flexible substrate 112 through one shadow mask 122, which is also positioned in deposition vacuum vessel 110. Substrate 112 and shadow mask 122 are described in more detail in reference to FIGS. 2, 3, and 4. Each deposition vacuum vessel 110 further includes one active heatsink 120, which provides a flat reference surface that is in contact with the non-deposition side of substrate 112 and which serves as a heat removal mechanism for substrate 112 as it translates through production system 100. Details of active heatsink 120 are further described in reference to FIGS. 4 through 7.

Those skilled in the art will appreciate that production system 100 may include additional stages (not shown), such as an anneal stage, a test stage, one or more cleaning stages, a cut and mount stage, and the like, as is well known. In addition, the number, purpose and arrangement of deposition vacuum vessels 110 can be modified as needed for depositing one or more materials required for a particular application by one of ordinary skill in the art.

Figure 2:
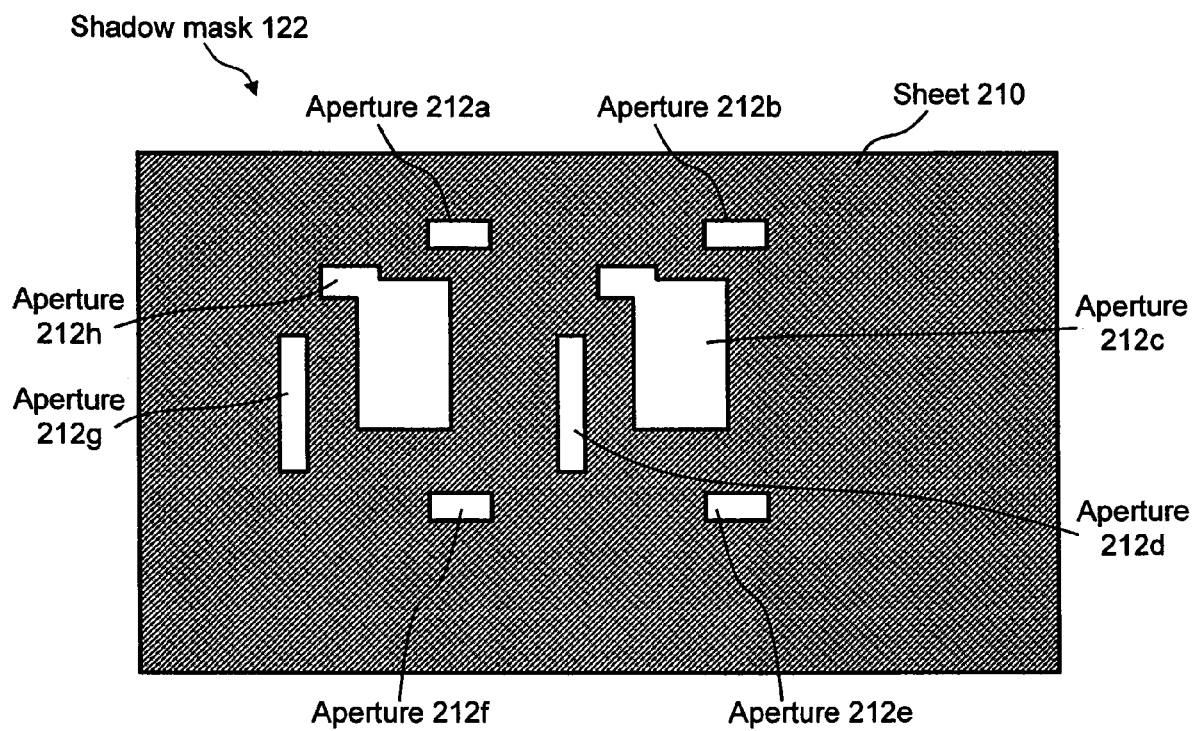
FIG. 2 illustrates a top view of an exemplary shadow mask formed of a material that has a low CTE in accordance with the present invention.

Each shadow mask 122 includes a pattern of apertures (not shown), e.g., slots and holes, as described in reference to FIG. 2. The pattern of apertures formed in each shadow mask 122 corresponds to a desired pattern of material to be deposited on substrate 112 from deposition sources 118 in deposition vacuum vessels 110, respectively, as substrate 112 is advanced through each deposition vacuum vessel 110.

Figure 3:
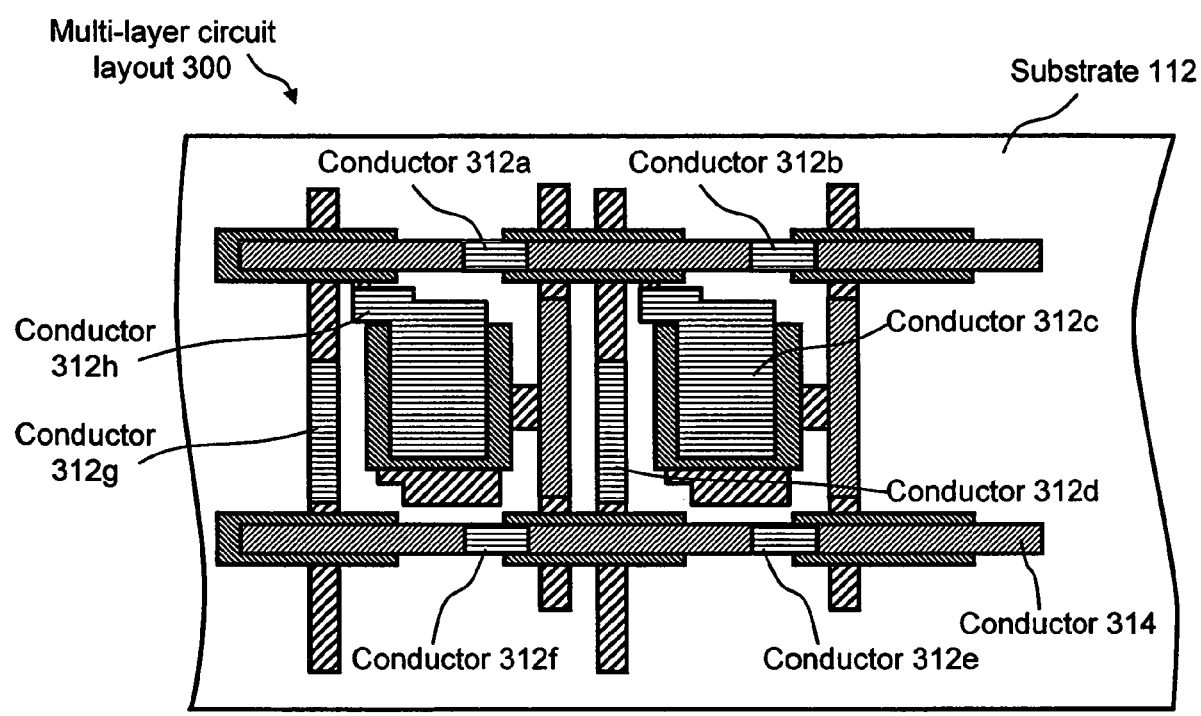
FIG. 3 illustrates a top view of an exemplary multi-layer circuit layout formed upon a substrate that is formed of a material that has a low CTE amenable to thermal regulation in accordance with the present invention.

As is well-known, deposition vacuum vessels 110 are utilized for depositing materials on substrate 112, in order to form one or more electronic elements on substrate 112. Each electronic element may be, for example, a thin film transistor (TFT), a diode, a memory element, or a capacitor. A multi-layer circuit, such as multi-layer circuit layout 300 of FIG. 3, is formed solely by the successive deposition of materials on substrate 112 via the successive operation of each deposition vacuum vessel 110.

Each deposition vacuum vessel 110 is connected to a source of vacuum (not shown) for establishing a suitable vacuum therein. More specifically, the source of vacuum establishes a suitable vacuum in deposition vacuum vessels 110, in order to enable a charge of the desired material that is positioned in deposition sources 118 to be deposited on substrate 112 in a manner known in the art, e.g., sputtering or vapor phase deposition, through apertures within the sheets of shadow masks 122.

In the following description of production system 100, substrate 112 will be described as being a continuous flexible sheet, which is initially disposed on a dispensing reel 114 that dispenses substrate 112 into the first deposition vacuum vessel 110. Dispensing reel 114 is positioned in a preload vacuum vessel, which is connected to a source of vacuum (not shown) for establishing a suitable vacuum therein. However, production system 100 can be configured to continuously process a plurality of individual substrates 112. Each deposition vacuum vessel 110 includes supports or guides that avoid the sagging of substrate 112 as it is advanced through deposition vacuum vessels 110.

In operation of production system 100, the material positioned in each deposition source 118 is deposited on substrate 112 through shadow mask 122 in the presence of a suitable vacuum as substrate 112 is advanced through each deposition vacuum vessel 110, whereupon plural progressive patterns are formed on substrate 112. More specifically, substrate 112 has plural portions that are positioned for a predetermined interval in each deposition vacuum vessel 110. During this predetermined interval, material is deposited from one or more deposition sources 118 onto the portion of substrate 112 that is positioned in the corresponding deposition vacuum vessel 110. After this predetermined interval, substrate 112 is step advanced, whereupon the plural portions of substrate 112 are advanced to the next deposition vacuum vessel 110 in series for additional processing, as applicable. This step advancement continues until each portion of substrate 112 has passed through all deposition vacuum vessels 110. Thereafter, each portion of substrate 112 exiting deposition vacuum vessel 110 is received on take-up reel 116, which is positioned in a storage vacuum vessel (not shown). Alternatively, each portion of substrate 112 exiting deposition vacuum vessel 110 is separated from the remainder of substrate 112 by a cutter (not shown).

FIG. 2 illustrates a top view of an exemplary shadow mask 122. Shadow mask 122 includes a sheet 210 formed of, for example, nickel, chromium, steel, copper, Kovar, or Invar. Kovar and Invar are low CTE materials known commercially as KOVAR™ or INVAR™ and supplied, for example, by ESPICorp Inc. (Ashland, Oreg.). Formed within sheet 110 is a pattern of apertures 212, which are openings of a predetermined size, shape, and location according to an associated circuit layout, such as illustrated in FIG. 3.

FIG. 3 illustrates a top view of an exemplary multi-layer circuit layout 300 formed upon substrate 112. Substrate 112 is formed of, for example, anodized aluminum, glass, or plastic, upon which is deposited multiple layers of conductors, such as a plurality of conductors 312 and a conductor 314 for forming multi-layer circuit layout 300, as is well known. Multi-layer circuit layout 300 is formed via successive deposition events by use of successive shadow masks 122 in production system 100, as described in FIG. 1.

With reference to FIGS. 2 and 3, apertures 212a, 212b, 212c, 212d, 212e, 212f, 212g, and 212h of shadow mask 122 are associated with the formation of conductors 312a, 312b, 312c, 312d, 312e, 312f, 312g, and 312h, respectively, upon substrate 112 of multi-layer circuit layout 300.

Figure 4:
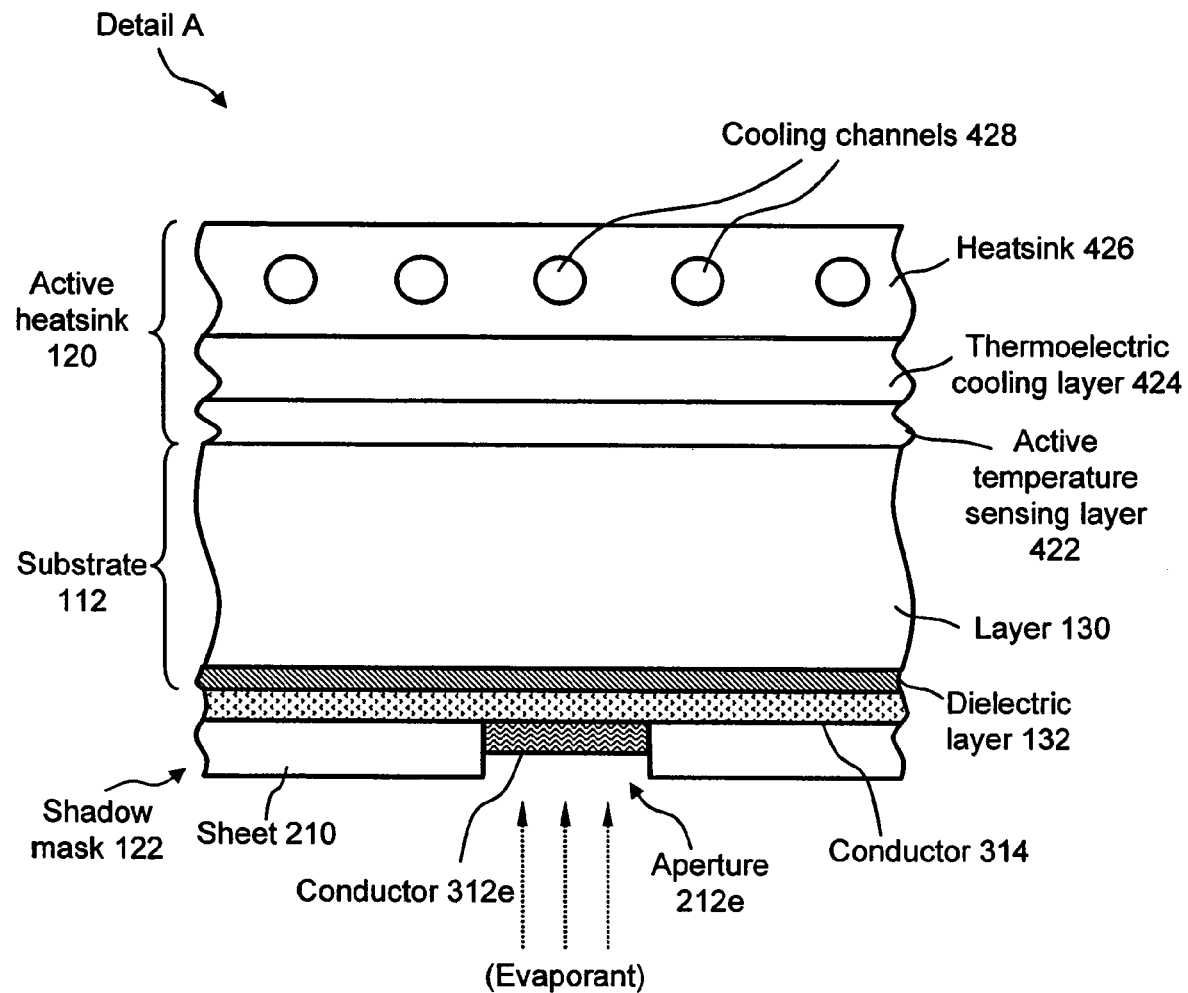
FIG. 4 illustrates a cross-sectional view of Detail A of FIG. 1.

FIG. 4 illustrates a cross-sectional view of Detail A of FIG. 1. FIG. 4 illustrates a highly magnified view of the major components of the shadow mask deposition process used to manufacture, for example, active display elements, such as OLEDs. More specifically, FIG. 4 shows a cross-sectional view of shadow mask 122 of FIG. 2 aligned with multi-layer circuit layout 300 of FIG. 3 formed upon substrate 112 and active heatsink 120 on the top side of substrate 112 (the surface opposite multi-layer circuit layout 300).

FIG. 4 further depicts shadow mask 122 aligned and in physical contact with substrate 112, upon which the deposition event takes place. In this example, the material forming conductor 312e is deposited by the evaporant from deposition source 118 as it passes through aperture 212c of shadow mask 122. Substrate 112 is formed of a base layer 130 formed of, for example, anodized aluminum, glass, or plastic, upon which is grown a dielectric layer 132, which serves as an insulation layer upon which conductors are deposited. For example, a thin layer of anodized aluminum oxide is chemically grown on layer 130 and thereby produces dielectric layer 132. Layer 130 of substrate 112 is, for example, 100–150 microns thick. Dielectric layer 132 of substrate 112 is, for example, a few hundred nanometers thick. Sheet 210 of shadow mask 122 is, for example, 2–25 microns thick.

Active heatsink 120 includes an active temperature sensing layer 422, a thermoelectric cooling layer 424, and a heatsink 426, which contains a plurality of cooling channels 428.

Active temperature sensing layer 422 is a solid state temperature sensing apparatus that is capable of taking discrete temperature measurement samples across the entire two-dimensional surface area of substrate 112 in a plurality of minute and contiguous areas, for example 1 $cm^2$ on center, and smaller, e.g., 1 $\mu m^2$. Active temperature sensing array 422 further includes a plurality of temperature measurement elements (not shown). A schematic representation of an exemplary temperature measurement element is further described in reference to FIG. 5. Thermoelectric cooling layer 424 is a solid state thermoelectric cooling device that is capable of transferring heat energy away from substrate 112. Thermoelectric cooling layer 424 includes a plurality of small (1 mm×2 mm) and individually controllable thermoelectric cooling modules (not shown) that are distributed across the entire two-dimensional surface area of substrate 112. A representation of an exemplary thermoelectric cooling module is further described in reference to FIG. 6. Heatsink 426 is a metal mass, for example, aluminum, that is designed to absorb thermal energy and channel it away from substrate 112. Cooling channels 428 enable the circulation of liquid coolant, for example water, that efficiently removes heat from heatsink 426, as is well known.

Figure 5:
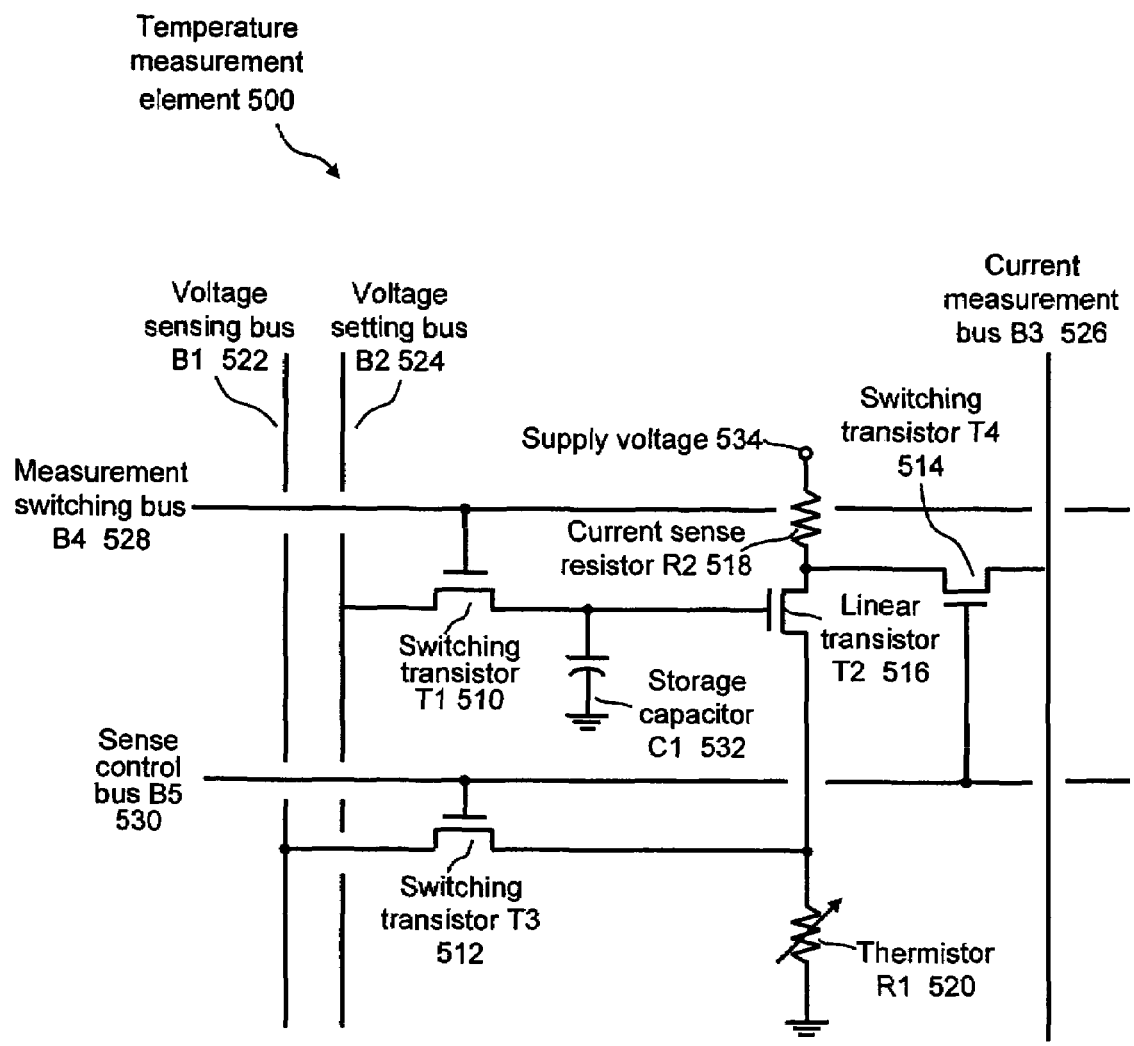
FIG. 5 illustrates a temperature measurement element that is used in a high-temperature deposition process and that is useful in regulating the heating effects upon the shadow mask and the substrate.

FIG. 5 illustrates a schematic representation of an exemplary temperature measurement element 500. Temperature measurement element 500 is the smallest individually controllable temperature measuring element within active temperature sensing layer 422. Temperature measurement element 500 includes a plurality of switching transistors T1 510, T3 512, and T4 514, a linear transistor T2 516, a current sense resistor R2 518, a thermistor R1 520, a voltage sensing bus B1 522, a voltage setting bus B2 524, a current measurement bus B3 526, a measurement switching bus B4 528, a sense control bus B5 530, a storage capacitor C1 532, a supply voltage 534, and a process control computer (not shown). The process control computer is programmed to control all bus signals in temperature measurement element 500, as is well known to those skilled in the art.

With continuing reference to FIG. 5, linear transistor T2 516 controls the current through thermistor R1 520. Switching transistor T1 510 sets current through linear transistor T2 516 and, hence, thermistor R1 520, by connecting voltage setting bus B2 524 to storage capacitor C1 532 and T2 516, as shown in FIG. 5. This voltage is maintained by storage capacitor C1 532 after T1 510 is turned OFF. The voltage across current sense resistor R2 518 is a direct measure of the current passing therethrough and of the current passing through T2 516 and thermistor R1 520. This current is measured on current measurement bus B3 526 after activating sense control bus B5 530. The voltage between current measurement bus B3 526 and supply voltage 534 divided by the known resistance of current sense resistor R2 518 yields the current in thermistor R1 520. In a similar manner, the voltage across thermistor R1 520 is measured on voltage sensing bus B1 522 through T3 512, activated in tandem with T4 514 by the control voltage on sense control bus B5 530. The resistance of thermistor R1 520 is given by the voltage as measured on voltage sensing bus B1 522 divided by the current passing through thermistor R1 520. An appropriate temperature vs. thermistor R1 520 resistance, calibrated by the process control computer (not shown), then yields the temperature being measured.

Figure 6:
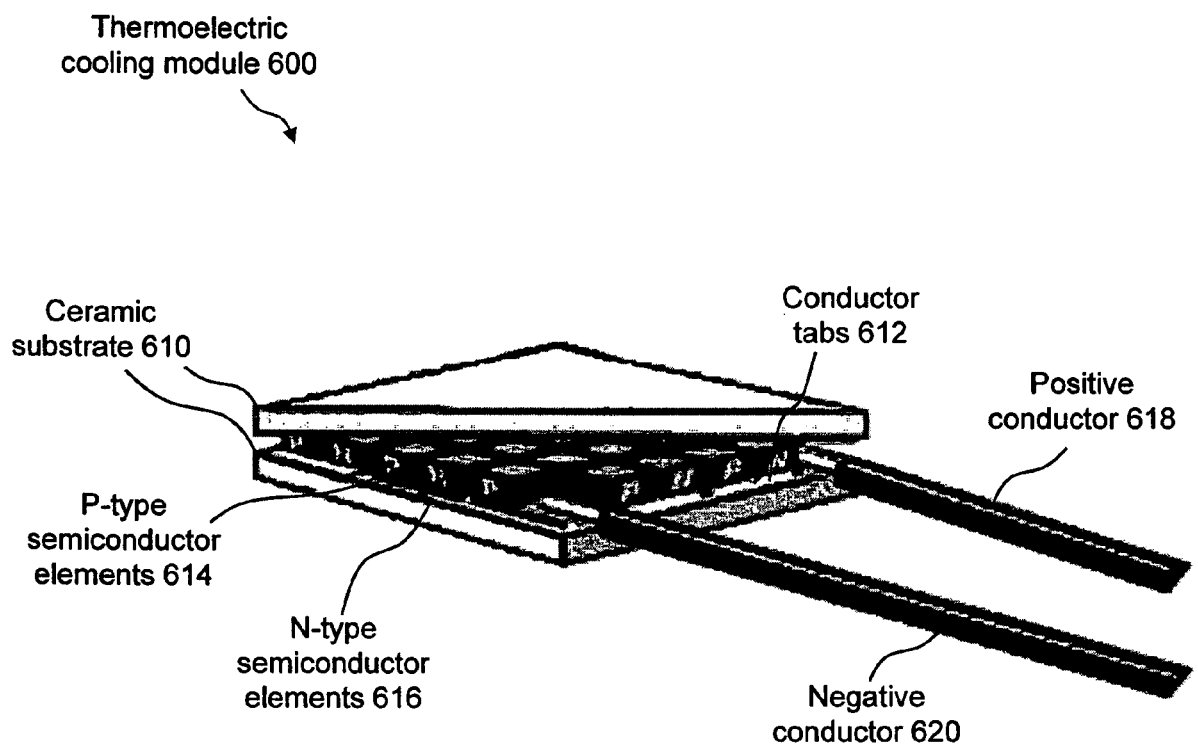
FIG. 6 illustrates a thermoelectric cooling element that is used in a high-temperature deposition process and that is useful in regulating the heating effects upon the shadow mask and the substrate.

FIG. 6 illustrates a perspective view of an exemplary thermoelectric cooling module 600. Thermoelectric module 600 is the smallest individually controllable cooling element within thermoelectric cooling layer 424. Each thermoelectric cooling module 600 further includes a plurality of p-type semiconductor elements 614 and n-type semiconductor elements 616 that are connected in series throughout the device by conductor tabs 612 formed on a metalized ceramic substrate 610, which supports the device. Thermoelectric cooling module 600 is activated by the application of an electrical current through a positive conductor 618 and a negative conductor 620. Cooling levels are proportional to the magnitude of the current supplied to thermoelectric cooling module 600. Some exemplary thermoelectric cooling devices include Marlow Industries, Inc. (Dallas Tex.) model MI1010T and RMT ltd. (Moscow, Russia) model 1MT03.

With reference to FIGS. 1 through 6, shadow mask 122 is aligned and held in physical contact with substrate 112 within a given deposition vacuum vessel 110 of production system 100. The temperature of shadow mask 122 and substrate 112 may typically be in the range of 20–100° C. during the deposition event. The material that forms sheet 210 of shadow mask 122 is exposed to this heat unevenly; consequently, shadow mask 122 is subject to hot spots and temperature gradients across its surface, and the resulting thermal transfer through sheet 210 causes substrate 112 to absorb heat. However, active temperature sensing layer 422 detects and transmits the temperature gradient across substrate 112 to process control computer (not shown). As a result, the process control computer controls thermoelectric cooling layer 424 in order to proportionally cool thermal hot spots and minimize thermal gradients across the face of substrate 112 and, subsequently, shadow mask 122. Even with marginal expansion or contraction, there is minimal or negligible relative movement of the two bodies; thus, shadow mask 122 and substrate 112 remain aligned, i.e., apertures 212 of shadow mask 122 continue to align properly with multi-layer circuit layout 300, which is formed upon substrate 112.

Figure 7:
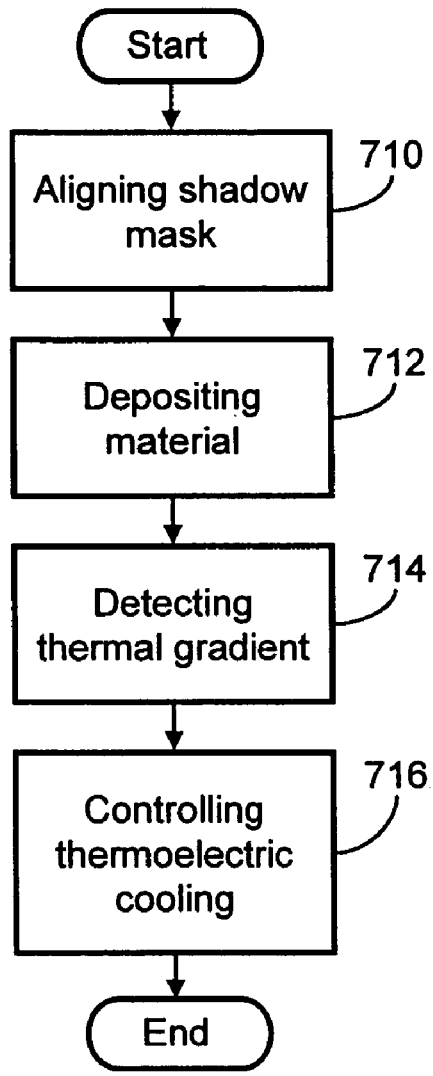
FIG. 7 illustrates a flow diagram of a method of using an active array of temperature sensing and cooling elements in accordance with the invention.

FIG. 7 illustrates a flow diagram of a method 700 of using an active array of temperature sensing and cooling elements in accordance with the invention. With continuing reference to FIGS. 1 through 7, method 700 includes the following steps.

At step 710, a shadow mask 122 is aligned and held in physical contact with substrate 112 within a given deposition vacuum vessel 110 of production system 100.

At step 712, a deposition event occurs within a deposition vacuum vessel 110 of production system 100, and the material that forms sheet 210 of shadow mask 122 is exposed unevenly to heat that is generated during the deposition process. Consequently, hot spots and temperature gradients are generated across the surface of shadow mask 122, and the resulting thermal transfer through sheet 210 causes substrate 112 to absorb heat.

At step 714, each active temperature sensing layer 422 detects and transmits the temperature gradient across substrate 112 to the process control computer (not shown).

At step 716, the process control computer controls thermoelectric cooling layer 424 to proportionally cool thermal hot spots and minimize thermal gradients across the face of substrate 112. The resulting thermal transfer causes shadow mask 122 to cool. Even with marginal expansion or contraction, there is minimal or negligible relative movement of the two bodies; thus, shadow mask 122 and substrate 112 remain aligned, i.e., apertures 212 of shadow mask 122 continue to align properly with multi-layer circuit layout 300 that is formed upon substrate 112. Method 700 ends.

Although the invention has been described in detail in connection with the exemplary embodiments, it should be understood that the invention is not limited to the above disclosed embodiments. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method of reducing shadow mask-to-substrate misalignment during a high-temperature deposition process, the method comprising the steps of:
   employing a shadow mask to provide at least one pattern of a high-resolution display on a bottom surface of a substrate;
   providing a temperature sensing layer over a top surface of the substrate; and
   providing a thermoelectric cooling layer over the temperature sensing layer;
   regulating the temperature across at least one unevenly heated region of the substrate, wherein the step of regulating the temperature comprises:
   sensing a temperature gradient of the unevenly heated region of the substrate by measuring the temperature across at least two different points of the unevenly heated region with a plurality of temperature measurement elements of the temperature sensing layer;
   transmitting the temperature of the unevenly heated region to a controller computer; and
   transferring heat energy from the substrate by controlling a plurality of thermoelectric cooling modules of the thermoelectric cooling layer by the controller computer.

* * * * *